(12) United States Patent
Hong

(10) Patent No.: US 7,368,300 B2
(45) Date of Patent: May 6, 2008

(54) CAPACITOR IN SEMICONDUCTOR DEVICE AND METHOD FOR FABRICATING THE SAME

(75) Inventor: Duck-Hwa Hong, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/114,102

(22) Filed: Apr. 26, 2005

(65) Prior Publication Data

US 2006/0024894 A1   Feb. 2, 2006

(30) Foreign Application Priority Data

Jul. 30, 2004   (KR) .................. 10-2004-0060447

(51) Int. Cl.
  *H01L 21/00* (2006.01)
(52) U.S. Cl. .............. 438/3; 438/240; 257/E21.664
(58) Field of Classification Search .................. 438/3, 438/240
  See application file for complete search history.

(56) References Cited

U.S. PATENT DOCUMENTS 5,717,234 A * 2/1998 Si et al. .................. 257/295
6,294,425 B1 * 9/2001 Hideki .................. 438/253
2003/0054605 A1 * 3/2003 Kim et al. .................. 438/240
2003/0104638 A1 * 6/2003 Kim et al. .................. 438/3
2003/0116849 A1 * 6/2003 Suzuki et al. .................. 257/751

FOREIGN PATENT DOCUMENTS

KR    2001 39520    5/2001
KR    2003 24212    3/2003
KR    2003 24301    3/2003

OTHER PUBLICATIONS

Notice of Preliminary Rejection mailed on Mar. 16, 2006, issued by the Korean Intellectual Property Office in counterpart Korean Application No. 2004-60447 and English translation thereof.

* cited by examiner

*Primary Examiner*—H. Jey Tsai
(74) *Attorney, Agent, or Firm*—Finnegan, Henderson, Farabow, Garrett, & Dunner, L.L.P.

(57) ABSTRACT

The present invention relates to a capacitor in a semiconductor device and a method for fabricating the same. The capacitor fabrication method includes the steps of: forming a lower electrode by using a thin film of $(Ba,Sr)RuO_3$ (BSR) on a substrate provided with various device elements; forming a dielectric layer on the lower electrode by using a thin film of barium strontium titanate (BST); and forming an upper electrode on the dielectric layer.

9 Claims, 3 Drawing Sheets

CAPACITOR IN SEMICONDUCTOR DEVICE AND METHOD FOR FABRICATING THE SAME

FIELD OF THE INVENTION

The present invention relates to a method for fabricating a semiconductor device; and, more particularly, to a method for fabricating a capacitor in a semiconductor device by using barium strontium titanate (BST) as a dielectric layer.

DESCRIPTION OF RELATED ARTS

In a semiconductor memory device, particularly in a dynamic random access memory (DRAM) device, a large scale of integration of semiconductor devices has been led to a significant decrease in an area of a memory cell which is a basic unit for storing information.

The decrease in the memory cell area has further led to a decrease in a cell capacitor area which causes a sensing margin and a sensing speed to decrease and results in a weak tolerance to a soft error caused by a-particles. Therefore, it is necessary to develop a method for securing a sufficient capacitance within a limited cell area.

The capacitor capacitance (C) is defined as follows.

$$C = \epsilon * As/d \quad \text{Eq. 1}$$

Herein, $\epsilon$, As and d are a dielectric constant, an effective surface area and a distance between electrodes, respectively. Therefore, to increase the capacitor capacitance, an effective surface area of an electrode or a dielectric constant is increased, or a thickness of a dielectric layer is decreased.

Among the above mentioned methods, the method of increasing the effective surface area of the electrode has been primarily considered. The increase in the effective surface area of the electrode within a limited area is achieved by forming the capacitor in three dimensions such as a concave structure, a cylinder structure, a multi-pin structure and the like. However, this method of increasing the effective surface area of the electrode is limited as semiconductor devices have been highly integrated.

As another approach, decreasing a distance between electrodes is considered. To minimize the distance between the electrodes, it is proposed to decrease a thickness of a dielectric layer. However, there is a problem in that leakage currents increase as the thickness of the dielectric layer increases. Therefore, a current focus of increasing the capacitor capacitance is to increase a dielectric constant of the dielectric layer.

Typically, a capacitor is mainly formed in a nitride/oxide (NO) structure by using dielectric materials such as silicon oxide and silicon nitride. Recently, high dielectric materials such as $HfO_2$, $Ta_2O_5$, $(Ba,Sr)TiO_3$ (BST) and so on or ferroelectric materials such as $(Pb,Zr)TiO_3$ (PZT), $(Pb,La)(Zr,Ti)O_3$ (PLZT) and so on are used for a dielectric layer of the capacitor.

When a high dielectric capacitor or a ferroelectric capacitor is formed based on the above high dielectric material or ferroelectric material, it is required to control other materials adjacent to the employed dielectric material and related processes for the purpose of obtaining an intended dielectric characteristic of the high dielectric material or the ferroelectric material.

Generally, noble metals or noble-metal containing compounds are used for forming lower electrodes and upper electrodes of high dielectric capacitors or ferroelectric capacitors. Examples of such lower electrode and upper electrode materials are platinum (Pt), iridium (Ir), ruthenium (Ru), ruthenium oxide ($RuO_2$) and iridium oxide ($IrO_2$).

FIGS. 1A and 1B are cross-sectional views showing a conventional capacitor in a semiconductor device.

Referring to FIG. 1A, an inter-layer insulation layer 12 is formed on a substrate 10 provided with an active region 11. Although not illustrated, the inter-layer insulation layer 12 is etched to form a contact hole exposing the active region 11 of the substrate 10. Then, the contact plug 13 is filled with a conductive material. Herein, polysilicon is used as the conductive material for the contact plug 13.

Next, a lower electrode 14 and a dielectric layer 15 are sequentially formed on the contact plug 13 and a portion of the inter-layer insulation layer 12.

Referring to FIG. 1B, an upper electrode 16 is formed on the dielectric layer 15. At this time, if $(Ba,Sr)TiO_3$ (BST) is used as the dielectric material, the upper electrode 16 and the lower electrode 14 are made of a noble metal such as Ir, Ru or the like.

Among various high dielectric materials, the above mentioned thin BST layer with the Perovskite structure has a high dielectric constant and a good insulation characteristic. Also, a dielectric characteristic of the thin BST layer is minimally lost or dispersed even under a high frequency. Furthermore, since the thin BST layer exists as a paraelectric phase, there is not a fatigue or degradation problem. As a result of this effect, the thin BST layer can be applied to a highly dense and integrated capacitor requiring a high dielectric constant and low leakage current.

However, the dielectric constant and leakage current characteristics vary greatly depending on a process for fabricating a BST layer and a type of a capacitor material in contact with the thin BST layer. Also, even characteristics of the compounded BST layer vary differently depending on a composition ratio of the BST layer.

Since a noble metal such as iridium is used as an electrode material and the above mentioned BST layer is used as a dielectric material, it is difficult to form the thin BST layer stably on the electrode made of the noble metal due to irrelevant material characteristics between the BST and the noble metal.

SUMMARY OF THE INVENTION

It is, therefore, an object of the present invention to provide a method for fabricating a capacitor through a simplified process by using a material with a similar composition to that of a thin BST film used as a dielectric material of the capacitor.

In accordance with an aspect of the present invention, there is provided a method for fabricating a capacitor in a semiconductor device, including the steps of: forming a lower electrode by using a thin film of $(Ba,Sr)RuO_3$ (BSR) on a substrate provided with various device elements; forming a dielectric layer on the lower electrode by using a thin film of barium strontium titanate (BST); and forming an upper electrode on the dielectric layer.

In accordance with another aspect of the present invention, there is provided a capacitor in a semiconductor device, including: a thin BSR layer for use in a lower electrode formed on a substrate; a thin BST layer for use in a dielectric layer formed on the thin BSR layer; and an upper electrode formed on the thin BST layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A capacitor in a semiconductor device and a method for fabricating the same in accordance with a preferred embodiment of the present invention will be described in detail with reference to the accompanying drawings.

FIGS. 2A to 2D are cross-sectional views illustrating a method for fabricating a capacitor in a semiconductor device in accordance with a preferred embodiment of the present invention.

Figure 1A:
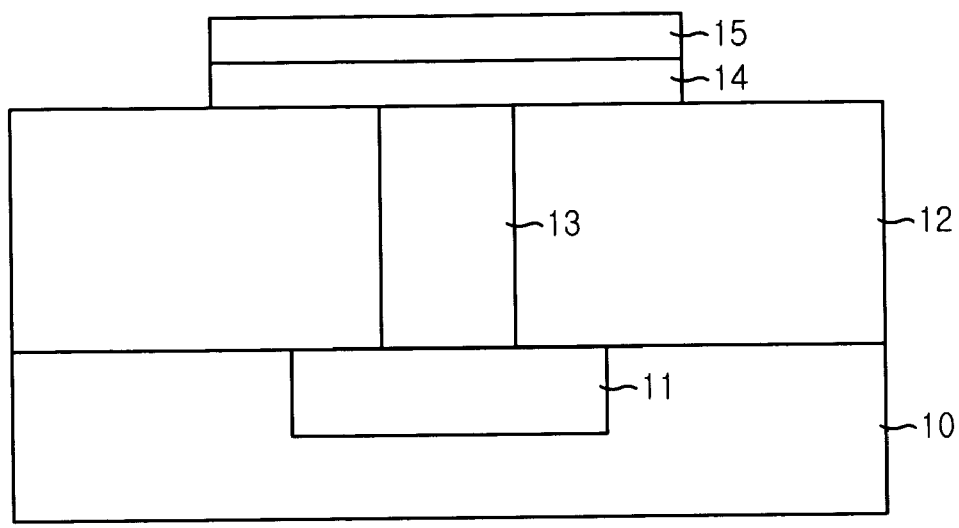
FIGS. 1A and 1B are cross-sectional views showing a conventional method for fabricating a capacitor.
Figure 1B:
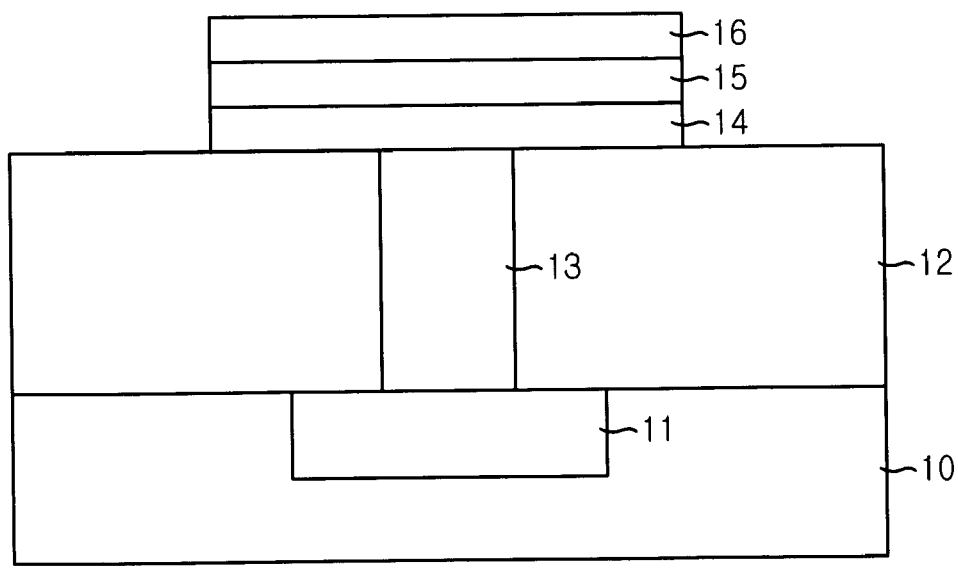
Figure 2A:
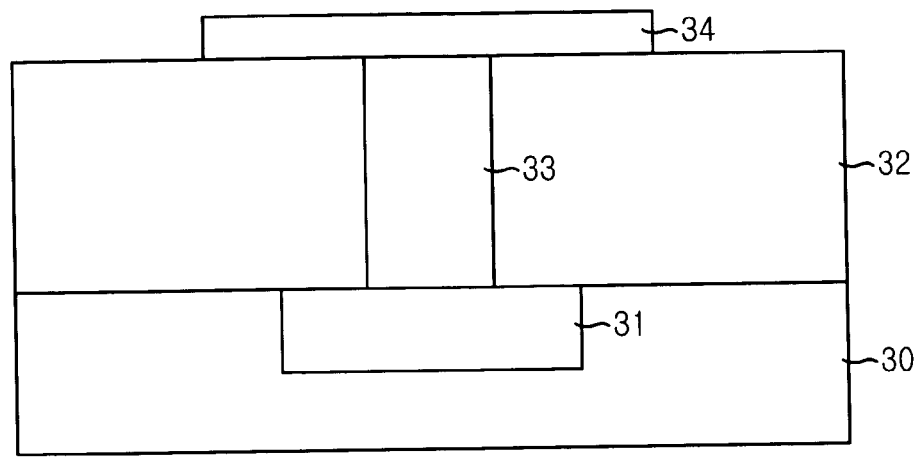
FIGS. 2A to 2D are cross-sectional views showing a method for fabricating a semiconductor device in accordance with a preferred embodiment of the present invention.

Referring to FIG. 2A, an inter-layer insulation layer 32 is formed on a substrate 30 provided with an active region 31. Then, although not illustrated, a contact hole that exposes the active region 31 of the substrate 30 by passing through the inter-layer insulation layer 32 is formed.

The inter-layer insulation layer 32 is formed by using an oxide-based material such as undoped silicate glass (USG), phosphosilicate glass (PSG), borophosphosilicate glass (BPSG) or high density plasma (HDP) oxide, spin on glass (SOG), or tetraethylorthosilicate (TEOS). Also, the inter-layer insulation layer 32 can be made of a thermal oxide layer that is formed by oxidizing a silicon substrate at a high temperature ranging from approximately 600° C. to approximately 1,100° C. at a furnace.

Next, a conductive material is filled into the contact hole, thereby forming a contact plug 33. Herein, the contact plug 33 is frequently made of polysilicon.

A titanium silicide layer 34 is formed in a manner to make a contact with the contact plug 33. The titanium silicide layer 34 acts as a diffusion barrier layer for preventing an increase of a contact resistance between the contact plug 33 and a subsequent lower electrode. Also, when an electrode is made of an oxide-based material, especially, $(Ba,Sr)RuO_3$ (BSR) and is formed on the contact plug 33 made of polysilicon, oxygen from the thin BSR layer and polysilicon from the contact plug 33 react with each other, producing a compound with a bad electric characteristic. Thus, the titanium silicide layer 34 serves another role in preventing generation of such compound. That is, the titanium silicide layer 34 blocks oxygen from getting into the contact plug 33.

Figure 2B:
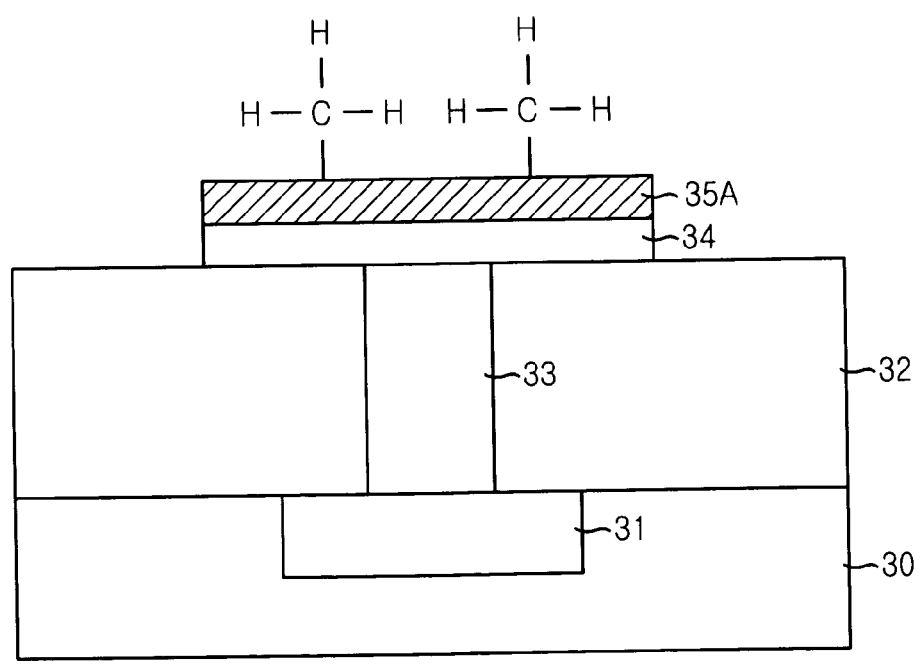

Referring to FIG. 2B, a first thin BSR layer 35A for forming a lower electrode is formed on the titanium silicide layer 34. The thin BSR layer is an oxide-based layer where bromine (Br), strontium (Sr) and ruthenium (Ru) are compounded together, and since the thin BSR layer has a similar composition to that of a thin BST layer which will be formed above the thin BSR layer, it is easier to set up a reliable process compared with the case of using other electrode materials.

Meanwhile, an area of an individual unit cell decreases as semiconductor memory devices have been highly integrated, and thus, even if a BST thin film with a high dielectric constant is used as a dielectric material, it is mandated to decrease a thickness of the thin BST layer in more extents.

More particularly, the thin BST layer is typically formed in a thickness of approximately 500 Å. However, because of the large scale of integration, the thickness of the thin BST layer should be decreased to approximately 200 Å to approximately 300 Å. If the thickness of the thin BST layer is decreased to this mentioned level, it is difficult to fabricate a capacitor in a planar structure. As a result, the capacitor is rather formed in a stack structure.

A step coverage characteristic is an important factor in the stack structure of the capacitor. For this reason, instead of employing a sputtering deposition method for forming a lower electrode, a metal organic chemical vapor deposition (MOCVD) method is employed. Especially, a low temperature MOCVD method is employed to obtain a good step coverage characteristic. However, the low temperature MOCVD method is limited because of several disadvantages such as low reliability, non-uniformity in a wafer and a non-decomposed substance material.

Therefore, although it is possible to use a typical tetramethylheptanedionato (TMHD)-based substance material for forming a lower electrode, there are problems of using the above substance material such as decomposition of the TMHD-based substance material and a vapor pressure decrease of the TMHD-based substance material caused by a delayed time due to oligomerization and the like.

Hence, the first BSR layer 35A is formed by using a single cocktail source obtained preferably by diluting methoxyethoxytetramethylheptanedionato barium $(Ba(METHD)_2)$ which is a thermally stable organic metal substance, methoxyethoxytetramethylheptanedionato strontium (Sr $(METHD)_2$), methoxyethoxytetramethylheptanedionato ruthenium $(Ru(METHD)_3)$ with an organic solvent of butylacetate $(C_6H_{12}O_2)$. At this time, the first thin BSR layer 35A is formed in a thickness of approximately 50 Å using the above mentioned single cocktail source.

When the fist thin BSR layer 35A is formed by employing the MOCVD method, there still remain organic impurities like carbons or hydrogens because of the use of a carbon or hydrogen containing metal organic precursor. These impurities result in a decrease in the conductivity of the thin BSR layer 35A and an increase in leakage currents caused by degradation of material characteristics of the first thin BSR layer 35A.

Therefore, after the first thin BSR layer 35A of which thickness is below approximately 50 Å is formed, the single cocktail source supply is stopped and a temperature is raised up to approximately 700° C. Afterwards, oxygen and nitrogen are supplied in-situ. At this time, if the temperature is greater than approximately 800° C., oxygen react with atoms of the first thin BSR layer 35A inducing a reduction reaction. For this reason, the temperature should be maintained to be in a range from approximately 500° C. to approximately 800° C. but not be greater than approximately 800° C.

This oxygen thermal treatment is particularly applied to effectively remove organic substances contained within the first thin BSR layer 35A, while the nitrogen thermal treatment is applied to improve crystallization of the first thin BSR layer 35A so as to increase the conductivity of the first thin BSR layer 35A. Also, the oxygen thermal treatment should be carried out for a short period, for instance, within five minutes, to remove the organic impurities of the first thin BSR layer 35A and to prevent the titanium silicide layer 34 which is a diffusion barrier layer against oxygen from oxidizing.

Herein, the nitrogen thermal treatment needs to be performed after the oxygen thermal treatment. The reason for this order of the thermal treatments is because if the nitrogen thermal treatment is performed prior to the oxygen thermal treatment, nitrogen stimulates crystallization of the organic impurities with the organic materials of the thin BSR layer 35A, thereby impairing a complete removal of the organic materials during the oxygen thermal treatment.

Although the MOCVD method is employed for forming the first thin BSR layer 35A in this preferred embodiment, the first thin BSR layer 35A can be still formed by employing other apparatuses such as a sputter, a vaporizer and the like. Also, although this preferred embodiment exemplifies the case of performing the oxygen thermal treatment and the nitrogen thermal treatment in-situ, these oxygen and nitrogen thermal treatments can be performed separately ex-situ.

Figure 2C:
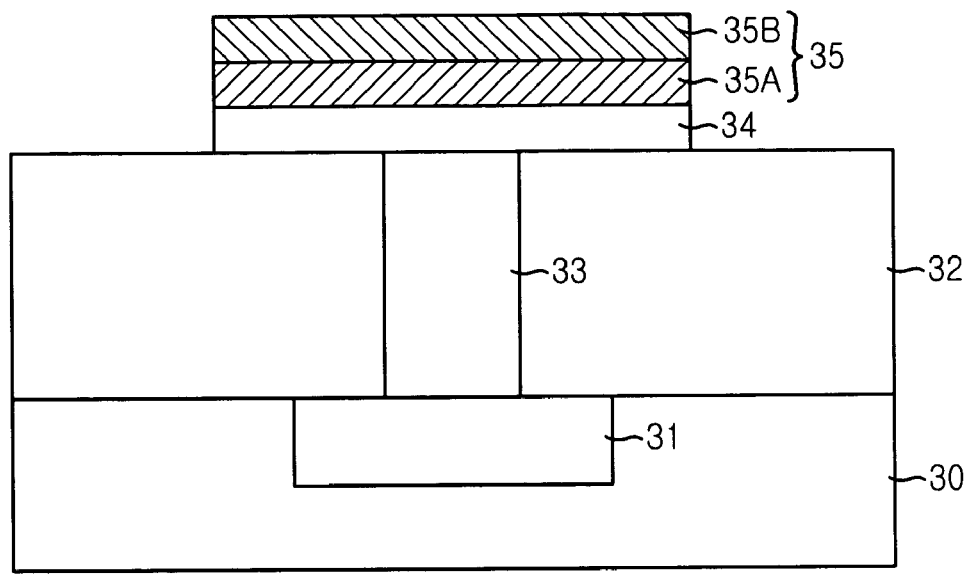

Referring to FIG. 2C, a second thin BSR layer 35B for forming the lower electrode is formed on the first thin BSR layer 35A. As shown, the thin BSR layer 35 is formed in two layers because it is not possible to form a thin epitaxial layer owing to the fact that the thin BSR layer 35 has a different lattice orientation from that of the titanium silicide layer 34. Thus, the first thin BSR layer 35A is formed as a seed layer and a thermal treatment is applied to the first thin BSR layer 35A to improve crystallinity of the first thin BSR layer 35A. Afterwards, the second thin BSR layer 35B is formed.

As mentioned above, the first thin BSR layer 35A and the second thin BSR layer 35B are formed through the MOCVD method. The source material for forming the BSR thin layer 35 passes through a vaporizer, thereby producing precursors which are, in turn, decomposed under an appropriate condition. As a result of the decomposition, Ba, Sr and Ru are deposited on a substrate structure, forming the thin BSR layer 35. Herein, as described above, the thermal treatment processes are performed after the formation of the first thin BSR layer 35A to improve crystallinity of a thin dielectric layer and enable an epitaxial growth of the second thin BSR layer 35B.

Also, the thin BSR layer 35 has a thickness ranging from approximately 200 Å to approximately 300 Å. Also, a deposition temperature is approximately 500° C., and a pressure is maintained approximately 2 torr. For an oxidizing agent, oxygen ($O_2$) gas is used, and an amount of the $O_2$ gas ranges from approximately 100 sccm to approximately 700 sccm. A composition ratio of Ba to Sr to Ru of the thin BSR layer 35 is set to be approximately 0.5 to approximately 0.5 to approximately 1.

After the formation of the thin BSR layer 35, a rapid thermal process for improving properties of the thin BSR layer 35 is carried out.

Figure 2D:
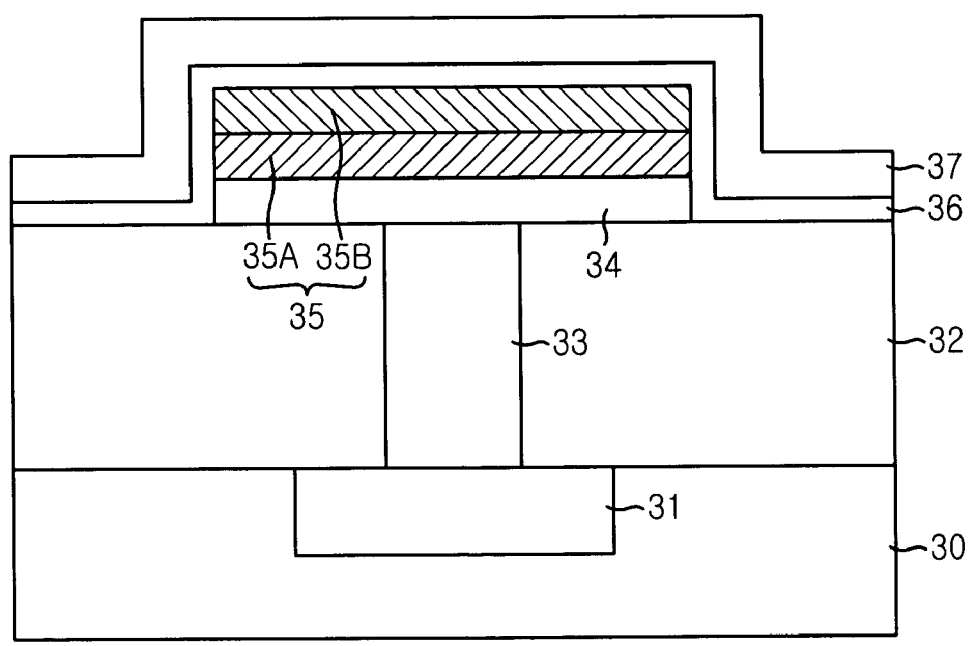

Referring to FIG. 2D, a thin BST dielectric layer 36 is formed on the thin BSR layer 35. The thin BST dielectric layer 36 can be grown epitaxially since the thin BST dielectric layer 36 is formed on top of the lower electrode made of the thin BSR layer 35. Afterwards, an upper electrode 37 is formed on the thin BST dielectric layer 36.

Herein, the upper electrode 37 is made of the same thin BSR film used for forming the lower electrode or another metal-based material selected singly or in combination from a group consisting of titanium nitride (TiN), tantalum nitride (TaN), tungsten (W), platinum (Pt), iridium (Ir), iridium oxide ($IrO_2$), ruthenium (Ru), ruthenium oxide ($RuO_2$), tungsten nitride (WN), and strontium ruthenate ($SrRuO_3$). Also, if the thin BSR film is used for forming the upper electrode 37, the same process recipe used for forming the lower electrode is applied to form the upper electrode 37.

In accordance with the present invention, when the dielectric layer of a capacitor is made of BST, a thin film of BSR is used for forming the lower electrode, and thus, it is possible to form a stable capacitor by forming the thin dielectric layer on the lower electrode with a similar lattice structure.

Also, on the basis of the present invention, the lower electrode is formed in two thin BSR layers. That is, the first thin BSR layer is formed as a seed layer, and then the oxygen thermal treatment and the nitrogen thermal treatment are carried out to remove organic impurities from the first thin BSR layer. Afterwards, the second thin BSR layer is formed on the seed layer, i.e., the first thin BSR layer. These sequential processes improve characteristics of the thin BSR layer such as leakage current, thereby enabling formation of a reliable capacitor.

The present application contains subject matter related to the Korean patent application No. KR 2004-0060447, filed in the Korean Patent Office on Jul. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor in a semiconductor device, comprising the steps of:
    forming a titanium silicide layer over a substrate having a plurality of device elements formed thereon;
    forming a first thin (Ba,Sr)$RuO_3$ (BSR) layer as a seed layer for a lower electrode on the titanium silicide layer;
    applying a thermal treatment to the first thin BSR layer after the first thin BSR layer is formed, wherein applying the thermal treatment includes applying an oxygen thermal treatment for removing organic impurities of the first thin BSR layer and applying a nitrogen thermal treatment for improving crystallinity of the first thin BSR layer;
    forming a second thin BSR layer for forming the lower electrode on the first thin BSR layer, wherein the lower electrode comprises the first and second thin BSR layers;
    forming a dielectric layer on the lower electrode by forming a thin film of barium strontium titanate (BST); and
    forming an upper electrode on the dielectric layer.

2. The method of claim 1, wherein the upper electrode is formed by using a thin film of BSR.

3. The method of claim 1, wherein the oxygen thermal treatment and the nitrogen thermal treatment are carried out in-situ.

4. The method of claim 1, wherein the oxygen thermal treatment and the nitrogen thermal treatment are carried out ex-situ.

5. The method of claim 1, wherein one of the oxygen thermal treatment and the nitrogen thermal treatment is carried out at a temperature ranging from approximately 500° C. to approximately 800° C.

6. The method of claim 1, wherein a total thickness of the first thin BSR layer and the second thin BSR layer ranges from approximately 200 Å to approximately 300 Å.

7. The method of claim 1, wherein the first thin BSR layer and the second thin BSR layer are formed by employing a metal organic chemical vapor deposition (MOCVD) method.

8. The method of claim 7, wherein the MOCVD method is carried out at a temperature of approximately 500° and a pressure of approximately 2 torr along with using oxygen ($O_2$) gas as an oxidizing agent provided in an amount ranging from approximately 100 sccm to approximately 700 sccm.

9. The method of claim 1, further including the step of performing a rapid thermal process to improve characteristics of the first and the second thin BSR layers after the step of forming the second thin BSR layer.

* * * * *